(12) United States Patent
Chiu et al.

(10) Patent No.: US 8,637,936 B2
(45) Date of Patent: Jan. 28, 2014

(54) METAL GATE TRANSISTOR WITH RESISTOR

(75) Inventors: Kai-Ling Chiu, Pingtung County (TW); Victor-Chiang Liang, Hsin-Chu (TW); Chih-Yu Tseng, Hsinchu (TW); Kun-Szu Tseng, Pingtung County (TW); Cheng-Wen Fan, Hsinchu County (TW); Hsin-Kai Chiang, Hsinchu (TW); Chih-Chen Hsueh, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 669 days.

(21) Appl. No.: 12/566,678

(22) Filed: Sep. 25, 2009

(65) Prior Publication Data

US 2011/0073957 A1 Mar. 31, 2011

(51) Int. Cl.
*H01L 27/11* (2006.01)

(52) U.S. Cl.
USPC ..... 257/379; 257/350; 257/380; 257/E29.326

(58) Field of Classification Search
USPC ............ 257/379, E27.03, 350, 358, 359, 363, 257/380, E29.326
See application file for complete search history.

(56) References Cited

U.S. PATENT DOCUMENTS

| | | | |
|---|---|---|---|
| 6,316,816 B1 * | 11/2001 | Matsumoto | 257/538 |
| 6,406,956 B1 | 6/2002 | Tsai | |
| 2006/0087401 A1 * | 4/2006 | Kerr et al. | 338/309 |
| 2009/0090977 A1 * | 4/2009 | Freeman et al. | 257/379 |

\* cited by examiner

*Primary Examiner* — Matthew Reames
(74) *Attorney, Agent, or Firm* — Winston Hsu; Scott Margo

(57) ABSTRACT

A resistor is disclosed. The resistor is disposed on a substrate, in which the resistor includes: a dielectric layer disposed on the substrate; a polysilicon structure disposed on the dielectric layer; two primary resistance structures disposed on the dielectric layer and at two ends of the polysilicon structure; and a plurality of secondary resistance structures disposed on the dielectric layer and interlaced with the polysilicon structures.

20 Claims, 8 Drawing Sheets

METAL GATE TRANSISTOR WITH RESISTOR

BACKGROUND OF THE INVENTION

1. Field of the Invention

The invention relates to a resistor structure, and more particularly, to an integrated structure of a metal gate transistor and a resistor.

2. Description of the Prior Art

In the field of semiconductor fabrication, the use of polysilicon material is diverse. Having a strong resistance for heat, polysilicon materials are commonly used to fabricate gate electrodes for metal-oxide semiconductor transistors. Devices fabricated by polysilicon however still have many drawbacks. In contrast to most metal, polysilicon gates are fabricated by semiconductor materials having high resistance, which causes the polysilicon gate to work under a much lower rate than other metal wires. In order to compensate for slightly lowered rate of performance, a significant amount of silicides is applied during the fabrication of polysilicon processes, such that the performance of the device could be increased to an acceptable level.

Gate electrodes fabricated by polysilicon also causes a depletion effect. In most circumstances, the optimum doping concentration for polysilicon is between about $2 \times 10^{20}/cm^3$ and $3 \times 10^{20}/cm^3$. As most gate electrodes have a doping concentration of at least $5 \times 10^{21}/cm^3$, the limited doping concentration of polysilicon gates often results in a depletion region at the interface between the gate and the gate dielectric layer. This depletion region not only thickens the gate dielectric layer, but also lowers the capacitance of the gate, and ultimately reduces the driving ability of the device. In order to solve this problem, work function metal gates are used to replace conventional polysilicon to fabricate gate electrodes for MOS transistors.

However, it is well known in the art that the degree of difficulty for fabricating a MOS transistor with work function metal gate is immense as the process often involves strict control for the thickness of material and balance of the ingredients, as well as complicated integration with other devices. Current approach of integrating a MOS transistor and a resistor typically involves the steps of forming a dummy polysilicon gate electrode on both resistor and transistor region of the substrate, removing at least a portion of the dummy polysilicon gate from the designated region, and filling a conductive material into the region where the dummy polysilicon gate was removed. Unfortunately, integrated structure fabricated from this approach usually results in poor control of temperature coefficient and voltage coefficient. Hence, how to successfully integrate the fabrication of a conventional work function metal gate transistor with other passive devices such as a resistor while resolving aforementioned issues has become an important study in the field.

SUMMARY OF THE INVENTION

It is an objective of the present invention to provide an integrated structure of a metal gate transistor with resistor to solve the aforementioned problem.

According to an embodiment of the present invention, a resistor is disclosed. The resistor is disposed on a substrate, in which the resistor includes: a dielectric layer disposed on the substrate; a polysilicon structure disposed on the dielectric layer; two primary resistance structures disposed on the dielectric layer and at two ends of the polysilicon structure; and a plurality of secondary resistance structures disposed on the dielectric layer and interlaced with the polysilicon structures.

According to another aspect of the present invention, an integrated structure of metal gate transistor with resistor is disclosed. The structure preferably includes: a substrate having a transistor region and a resistor region; a transistor disposed on the transistor region of the substrate; and a resistor disposed on the resistor region of the substrate. The transistor includes: a first dielectric layer disposed on the transistor region of the substrate; a metal gate disposed on the first dielectric layer; and a source/drain region formed adjacent to two sides of the metal gate. The resistor includes: a second dielectric layer disposed on the resistor region of the substrate; a polysilicon structure disposed on the second dielectric layer; two primary resistance structures disposed on the second dielectric layer and at two ends of the polysilicon structure; and a plurality of secondary resistance structures disposed on the second dielectric layer and interlaced with the polysilicon structures.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be detailed in the following. The preferred embodiments of the present invention are illustrated in the accompanying drawings with numbered elements. Like numbered numerals designate similar or the same parts, regions or elements. It is to be understood that the drawings are not drawn to scale and are only for illustration purposes.

Figure 1:
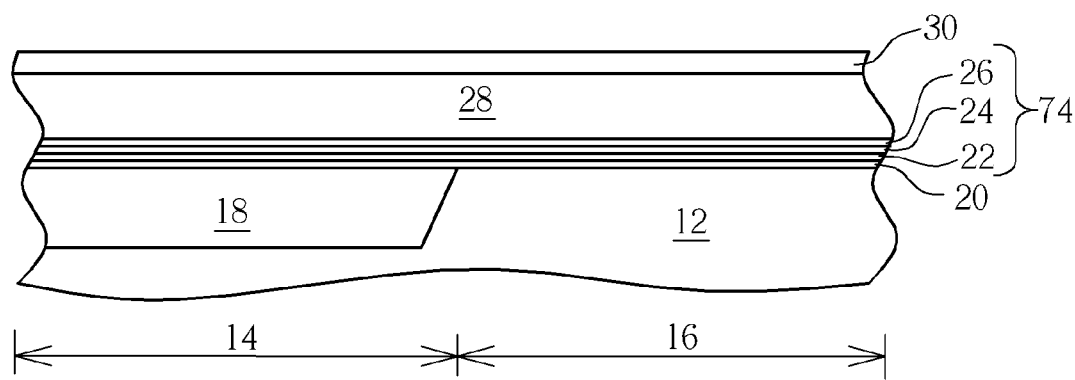
FIGS. 1-6 illustrate a method for integrating a resistor and a metal gate transistor according to a preferred embodiment of the present invention.

Referring to FIGS. 1-6, FIGS. 1-6 illustrate a method for integrating a resistor and a metal gate transistor according to a preferred embodiment of the present invention. As shown in FIG. 1, a substrate 12, such as a silicon substrate or a silicon-on-insulator (SOI) substrate is provided. A resistor region 14 and a transistor region 16 are defined on the substrate 12 and a shallow trench isolation 18 is formed in the substrate 12 of the resistor region 14.

A gate insulating layer 20 composed of dielectric material such as oxides or nitrides is deposited on the surface of the substrate 12 and a stacked film 74, a polysilicon layer 28, and a hard mask 30 are deposited on the gate insulating layer 20 thereafter, in which the stacked film 74 preferably includes a dielectric layer 22, a cap layer 24, and a metal layer 26. In this embodiment, the dielectric layer 22 is preferably composed of high-k dielectric material including HfSiO, HfSiON, HfO, LaO, LaAlO, ZrO, ZrSiO, HfZrO, or combination thereof the cap layer 24 is composed of LaO, $Dy_2O_3$, or combination thereof and the metal layer 26, depending on the type of transistor being fabricated, could be composed of n-type work function metal or p-type work function metal. For instance, if the transistor fabricated in the transistor region 16 is a NMOS transistor, the metal layer 26 is preferably composed of n-type metal such as TiN, TaC, Ta, TaSiN, Al, TiAlN, Ti, Hf or combination thereof. If the fabricated transistor is a PMOS transistor, the metal layer 26 is preferably composed of p-type metal such as TiN, W, WN, Pt, Ni, Ru, TaCN, or TaCNO. The polysilicon layer 28 is preferably composed of undoped polysilicon material, polysilicon containing n+ or p+ dopants, or other semiconductor or conductive material, and the hard mask 30 is composed of $SiO_2$, SiN, SiC, SiON, or combination thereof.

Figure 2:
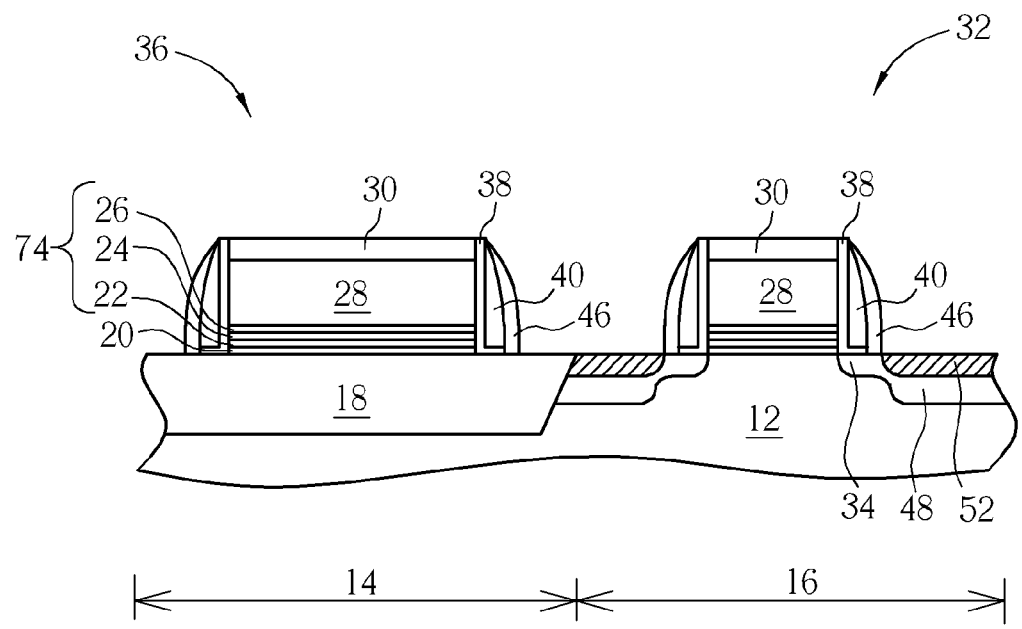

As shown in FIG. 2, the dielectric layer 22, the cap layer 24, the metal layer 26, the polysilicon layer 28, and the hard mask 30 are patterned to form a resistor structure 36 on the resistor region 14 and a gate structure 32 on the transistor region 16. Next, a light doping process is performed selectively to implant n-type or p-type dopants into the substrate 12 at two sides of the gate structure 32 of the transistor region 14 to form a lightly doped source/drain 34.

A first stage spacer formation is conducted thereafter by oxidizing the surface of the resistor structure 36 and the gate structure 32 or through deposition process to form a silicon oxide layer 38, depositing a silicon nitride layer 40 and etching back the silicon nitride layer 40 to form a spacer composed of silicon oxide layer 38 and silicon nitride layer 40 on the sidewall of the resistor structure 36 and the gate structure 32 of the transistor region 16. A second stage spacer formation is conducted thereafter to form a spacer 46 composed of silicon oxide on the silicon nitride 40 of the resistor region 14 and the transistor region 16. Following the spacer formation, a heavy doping process is conducted to implant n-type or p-type dopants into the substrate 12 adjacent to two sides of the spacer 46 to form a source/drain region 48 in the transistor region 16.

It should be noted that the aforementioned source/drain region 48 could be fabricated by using selective epitaxial process, the order of the fabrication process could be rearranged or adjusted according to the demand of the product, and the number of the spacers could also be adjusted accordingly. For instance, either one of the silicon oxide layer 38, the silicon nitride layer 40, or the silicon oxide layer 46 formed during the spacer formation process could be omitted. Moreover, the main spacer composed of silicon oxide layer 38 and the silicon nitride layer 40 could be fabricated before or after the formation of the lightly doped source/drain 34; the main spacer composed of silicon oxide layer 38 and the silicon nitride layer 40 and the source/drain region could be formed before removing the spacer and forming the lightly doped source/drain 34; the spacers could be formed before an epitaxial layer is formed in the recess of the semiconductor substrate, and the outer most spacer is removed before forming the source/drain region; a recess could be formed in the semiconductor substrate to deposit an epitaxial layer after forming the lightly doped source/drain, and the spacer and source/drain region are formed thereafter. The aforementioned order for fabricating lightly doped source/drain, spacers, and source/drain region could all be adjusted according the demand of the product, which are all within the scope of the present invention.

After the source/drain region 48 is formed, a self-aligned silicide (salicide) process is performed. For instance, a film (not shown) composed of $SiO_2$ or tetraethoxysilane (TEOS) is formed in the resistor region 14 and the transistor region 16, and an etching process is conducted to remove a portion of the film to form a salicide block (SAB) on surface of the substrate 12 not intended to form a silicide layer.

The salicide block is then used as a mask to deposit a metal layer (not shown) composed of cobalt, titanium, nickel, platinum, palladium, or molybdenum over the surface of the substrate 12, the resistor structure 36, the gate structure 32, and the spacer 46, and a rapid thermal annealing process is conducted to form a silicide 52 on the substrate 12 adjacent to two sides of the spacer 46. Un-reacted metal layer remained from the salicide process is removed thereafter.

Figure 3:
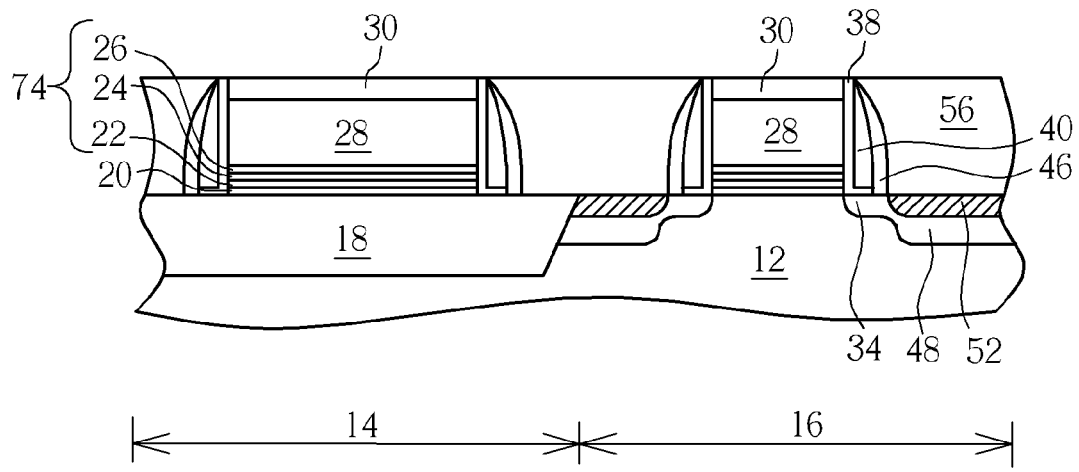

As shown in FIG. 3, an interlayer dielectric layer 56 composed of oxides is deposited on the resistor structure 36 and the gate structure 32. The interlayer dielectric layer 56 could be composed of nitrides, carbides, low dielectric constant material, or combination thereof. A chemical mechanical polishing (CMP) or a dry etching process is performed to remove a portion of the interlayer dielectric layer 56 until reaching and exposing the hard mask 30, such that the top surface of the hard mask 30 is substantially even with the surface of the interlayer dielectric layer 56.

Figure 4:
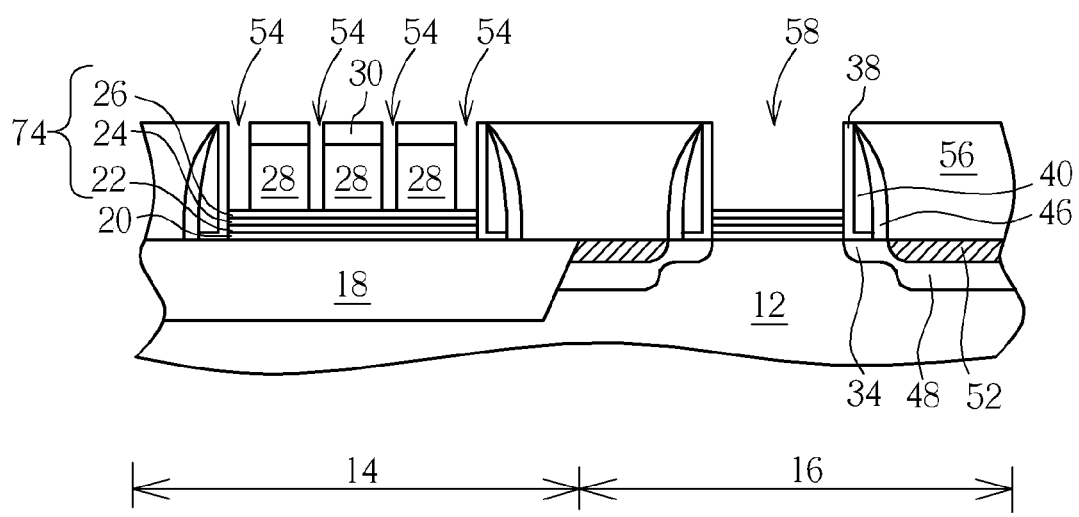

As shown in FIG. 4, a series of dry etching or wet etching is conducted selectively by using ammonium hydroxide ($NH_4OH$) or tetramethylammonium hydroxide (TMAH) to remove only a portion of the hard mask 30 and polysilicon layer 28 disposed in the resistor region 14 and the entire hard mask 30 and polysilicon layer 28 disposed in the transistor region 16. The etching process preferably forms a plurality of openings 54 in the resistor region 14 and an opening 58 in the transistor region 16, in which both openings 54/58 expose the metal layer 26 underneath.

Figure 5:
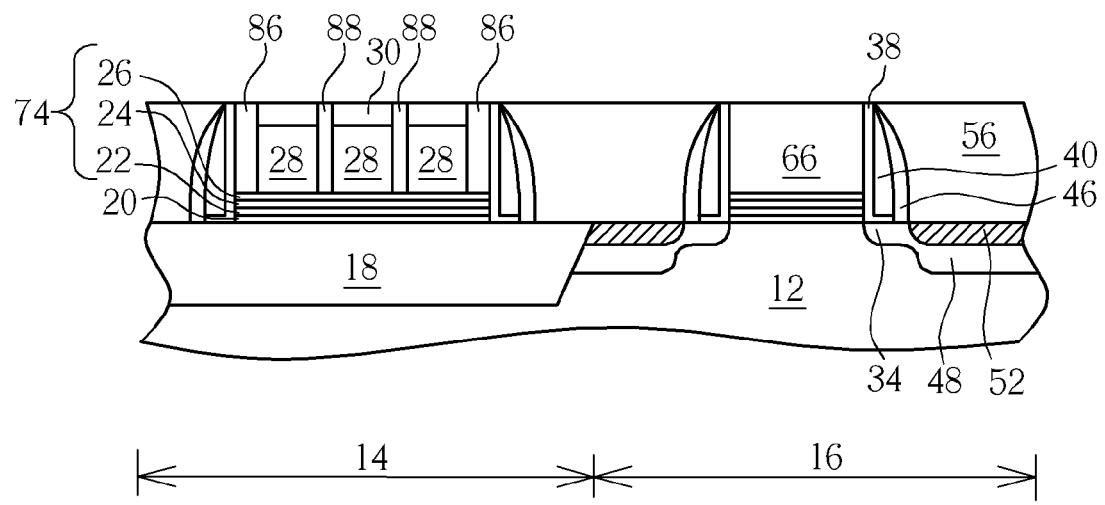

As shown in FIG. 5, a conductive layer (not shown) composed of low resistance material is first deposited on the interlayer dielectric layer 56 and into the openings 54/58, in which the conductive layer is preferably composed of Al, W, TiAl or CoWP. Subsequent to the deposition of the conductive layer, another chemical mechanical polishing process is performed to remove a portion of the conductive layer until reaching the interlayer dielectric layer 56 such that the top of the conductive layer is even with the surface of the interlayer dielectric layer 56 and the hard mask 30. This forms a transistor with metal gate 66 in the transistor region 16 and a resistor with two primary resistance structures 86 and two secondary resistance structures 88 horizontally interlaced with the polysilicon layer 28 in the resistor region 14. Preferably, the secondary resistance structures 88 fabricated along with the primary resistance structures 86 could be utilized to enhance the heat dissipating ability of the device substantially while reducing voltage coefficient and temperature coefficient of the resistor.

Figure 6:
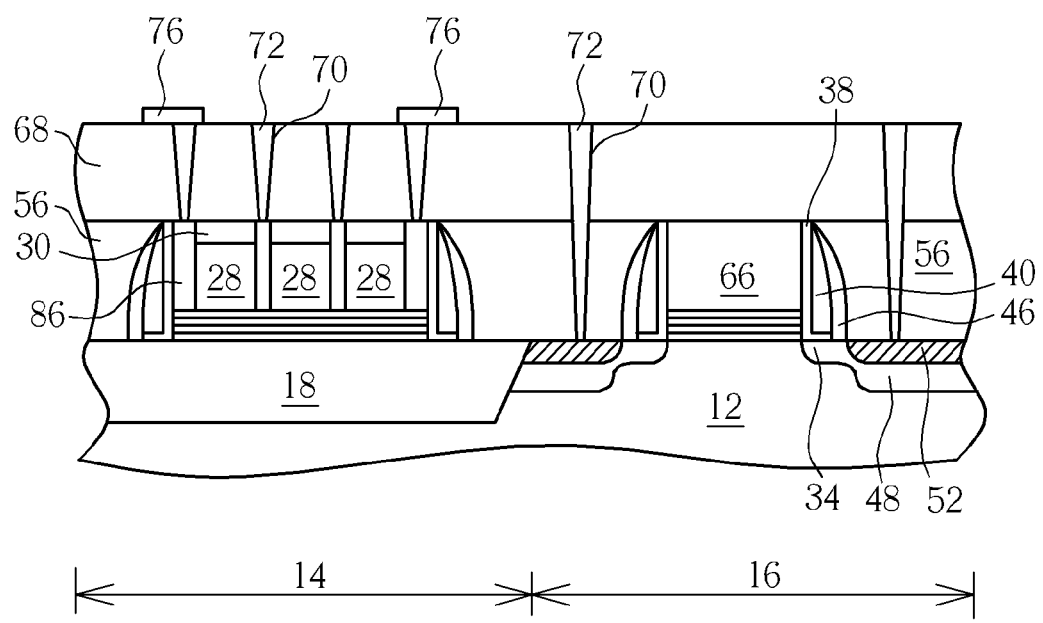

As shown in FIG. 6, a contact plug fabrication is performed by first forming another dielectric layer 68 on the resistor region 14 and the transistor region 16, and an etching is conducted by using a patterned photoresist (not shown) as mask to form a plurality of contact openings 70 in the dielectric layer 68 and interlayer dielectric layer 56. The contact openings 70 preferably expose the silicide 52 of the transistor region 16 and the primary and secondary resistor structures 86/88 of the resistor region 14.

A metal composed of tungsten or other conductive material is then deposited in the contact openings 70 to form a plurality of contact plugs 72 connecting the primary resistance structures 86 and secondary resistance structures 88 of the resistor region 14 and the silicide 52 of the transistor region 16. Additional metal interconnective processes could be performed thereafter to connect the primary resistance structures 86 with metal wires 76. Depending on the demand of the product, the secondary resistance structures 88 could also be connect to other metal wires, which is also within the scope of the present invention. This completes the fabrication of integrating a resistor structure and a transistor with metal gate 66 according to a preferred embodiment of the present invention.

Referring back to the structure shown in FIG. 5, an integrated structure having a resistor and a transistor with metal gate is disclosed. The resistor preferably includes a patterned stacked film 74 disposed on the substrate 12, a patterned polysilicon structure 28 disposed on the stacked film, two primary resistance structures 86 disposed on the stacked film 74 and at two ends of the polysilicon structure 28 by directly contacting the sidewall of the polysilicon structure 28, and two secondary resistance structures 88 disposed on the stacked film 74 while horizontally interlaced with the polysilicon structure 28. A patterned hard mask 30 is disposed on the polysilicon structure 28 and sandwiched between the primary resistance structures 86 and the secondary resistance structures 88. Despite only two primary resistance structures 86 and two secondary resistance structures 88 are revealed in this embodiment, the number and area of the resistance structures 86/88 could be adjusted to provide different resistance for the resistor, which is also within the scope of the present invention.

The transistor disposed in the transistor region 16 also includes a patterned stacked film 74 disposed on the substrate 12, a gate structure 66 disposed on the stacked film. A lightly doped source/drain 34, a source/drain region 48, and a silicide 52 are formed in the substrate 12 adjacent to two sides of the gate structure 66.

A spacer structure is disposed on the sidewall of the primary resistance structure 86 and the stacked film 74 of the resistor, and another spacer structure is disposed on the sidewall of the gate structure 66 of the transistor. The spacer structure in this embodiment preferably includes a silicon oxide layer 38, a silicon nitride layer 40, and a silicon oxide layer 46.

The stacked films 74 formed in the resistor region 14 and the transistor region 16 are disposed on a gate insulating layer 20, in which the stacked film preferably includes a dielectric layer 22, a cap layer 24, and a metal layer 26.

The dielectric layer 22 is preferably composed of high-k dielectric material including HfSiO, HfSiON, HfO, LaO, LaAlO, ZrO, ZrSiO, HfZrO, or combination thereof the cap layer 24 is composed of LaO, $Dy_2O_3$, or combination thereof and the metal layer 26, depending on the type of transistor being fabricated, could be composed of n-type work function metal or p-type work function metal. For instance, if the transistor fabricated in the transistor region 16 is a NMOS transistor, the metal layer 26 is preferably composed of n-type metal such as TiN, TaC, Ta, TaSiN, Al, TiAlN, Ti, Hf or combination thereof. If the fabricated transistor is a PMOS transistor, the metal layer 26 is preferably composed of p-type metal such as TiN, W, WN, Pt, Ni, Ru, TaCN, or TaCNO.

The polysilicon structure 28 in the resistor region 14 is preferably composed of undoped polysilicon material or polysilicon containing n+ or p+ dopants, or other semiconductor or conductive material, and the hard mask 30 is composed of $SiO_2$, SiN, SiC, SiON, or combination thereof.

The gate structure 66 of the transistor and the primary resistance structures 86 and secondary resistance structures 88 of the resistor are preferably composed of conductive material including Al, W, TiAl, or cobalt tungsten phosphide (CoWP). It should be noted that even though the resistor disclosed in this embodiment is fabricated along with the transistor, the resistor structure could also be fabricated independently, which is also within the scope of the present invention.

Figure 7:
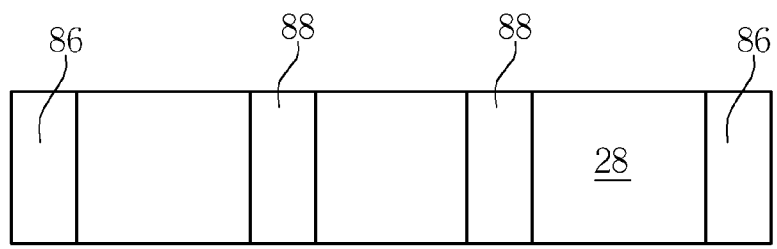
FIG. 7 illustrates top views of the primary and secondary resistance structures of the resistor according to different embodiments of the present invention.
Figure 7:
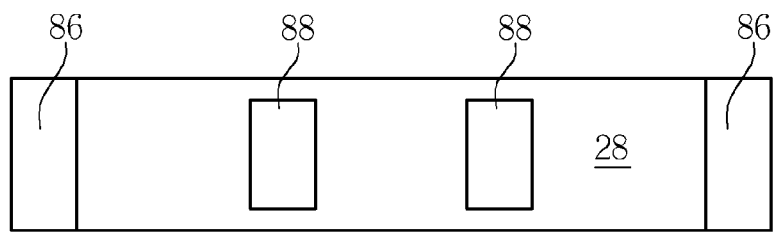
Figure 7:
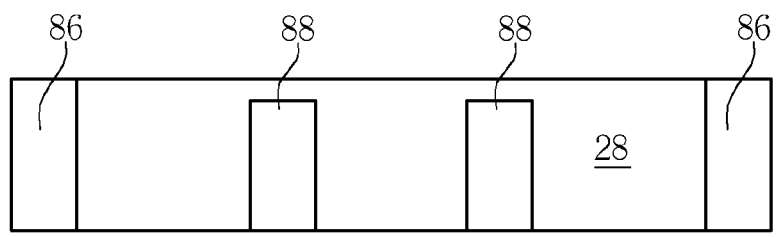
Figure 7:
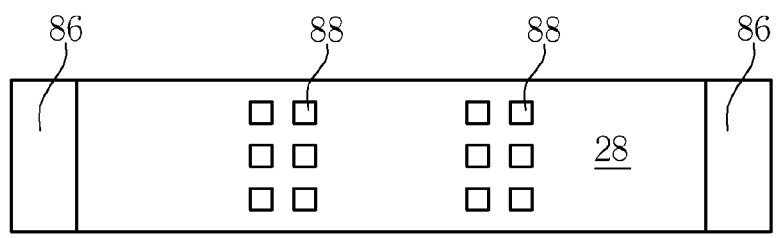
Figure 7:
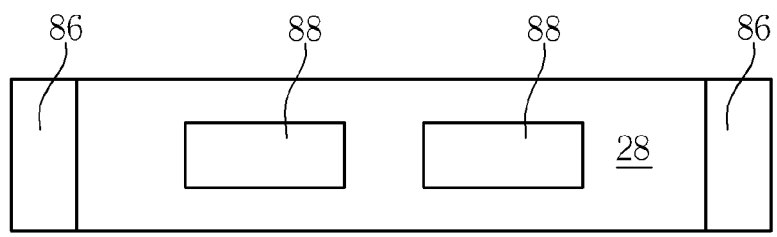

Referring to FIG. 7, FIG. 7 illustrates top views of the primary and secondary resistance structures of the resistor according to different embodiments of the present invention. Each of the resistor structure as revealed in FIG. 7 preferably includes two primary resistance structures 86 and two secondary resistance structures 88, but not limited thereto. The primary resistance structures 86 are disposed at two ends of the patterned polysilicon structure 28 for electrically connecting to interconnective wires, whereas the secondary resistance structures 88 are horizontally interlaced with the patterned polysilicon structure 28. In the first structure, the secondary resistance structures 88 are formed with respect to a completely cut design, in which the two ends of the secondary resistance structures 88 are exposed and aligned with the side edge of the polysilicon structure 28. In the second structure, the secondary resistance structures 88 are disposed with respect to a no cut design, in which the edges of the resistance structures 88 are completely surrounded by the polysilicon structure 28. In the third structure, the secondary resistance structures 88 are disposed with respect to a one side cut design, in which only one side of the structure 88 is exposed while the other side of the structure 88 is surrounded by the polysilicon structure 28. In the fourth structure, the secondary resistance structures 88 are disposed with respect to a square array design, whereas in the fifth structure, the secondary resistance structures are disposed according to a horizontal rectangular manner and parallel to the horizontal polysilicon structure 28.

It should be noted that the even only two primary resistance structures 86 and two secondary resistance structures 88 are revealed in the embodiments shown in FIGS. 7-11, the number and pattern of these resistance structures 86/88 could be adjusted by simply altering the pattern of the mask for producing desired number and pattern of the resistance structures.

Figure 8:
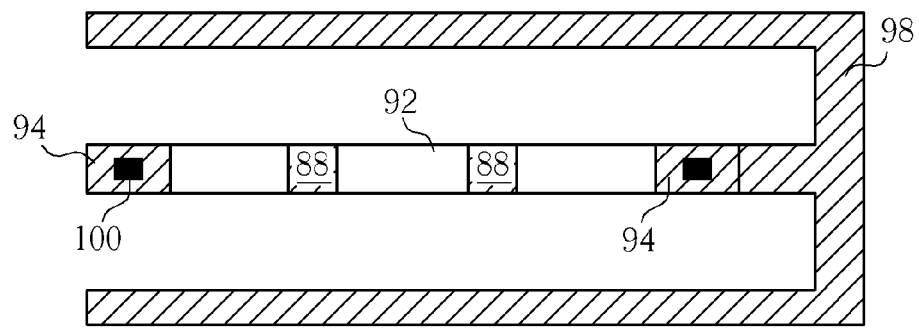
FIGS. 8-13 are top view diagrams illustrating various means for increasing heat dissipating ability of a resistor according to different embodiments of the present invention.

In addition to the aforementioned structures, various approaches could be utilized to improve the heat dissipating ability of the resistor. Referring to FIGS. 8-13, FIGS. 8-13 are top view diagrams illustrating various means for increasing heat dissipating ability of a resistor according to different embodiments of the present invention. As shown in FIG. 8, the resistor also includes a polysilicon structure 92 and two primary resistance structures 94 disposed at two ends of the polysilicon structure 92. Preferably, one of the primary resistance structures 94 disposed on one end of the polysilicon structure 92 is connected to a metal pattern 98, in which the metal pattern 98 is formed at the same level as the primary resistance structures 94 and secondary resistance structures 88, such as shown in FIG. 14. In other words, the metal pattern 98 is fabricated along with the formation of the primary resistance structures 94 and the metal gate 66 of the transistor region, such that the metal pattern 98 is preferably formed in the same interlayer dielectric layer 56 as the primary resistance structures 94. In this embodiment, salicide layers and interconnective contact plugs 100 are formed on the primary resistance structures 94, and the metal pattern 98 is connected to only one of the primary resistance structures 94. As shown in the design of FIG. 8, the metal pattern 98 is first extended at a distance before split into two different directions around most of the resistor.

Figure 9:
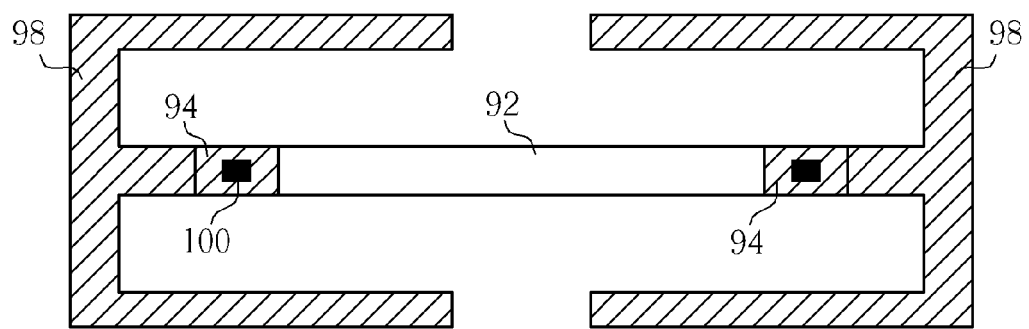

In addition to connecting the metal pattern 98 to only one of the primary resistance structures 94, the metal pattern could also be connected to both primary resistance structures 94 simultaneously, as shown in FIG. 9, which is also within the scope of the present invention.

Figure 10:
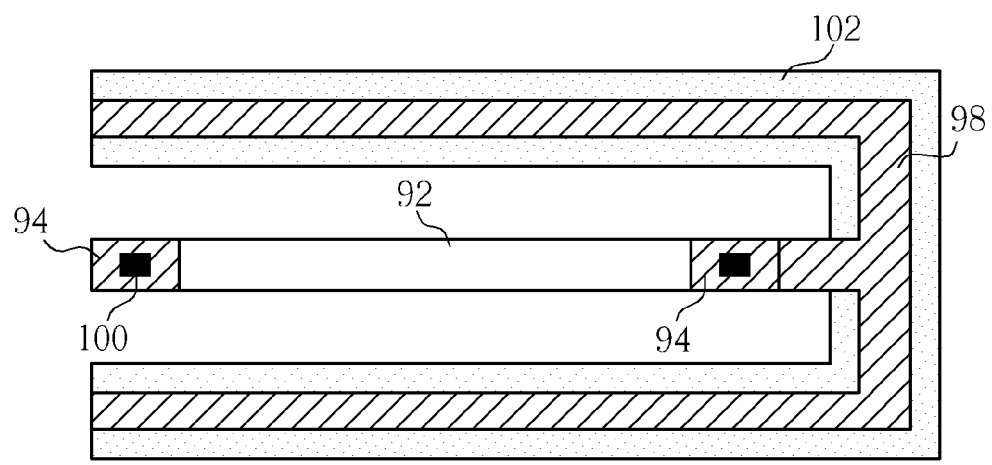

As shown in FIG. 10, a diffusion region 102 could be formed in the substrate adjacent to the extended metal pattern 98 to further enhance the heat dissipating ability of the resistor. The diffusion region 102 is preferably fabricated by using the same ion implantation process conducted for the formation of source/drains in the transistor region, and the dopants implanted into the substrate could be either n-type or p-type dopants. In addition to forming the diffusion region 102 adjacent to two sides of the metal pattern 98, the diffusion region 102 could also be formed directly under the metal pattern 98, which is also within the scope of the present invention.

Figure 11:
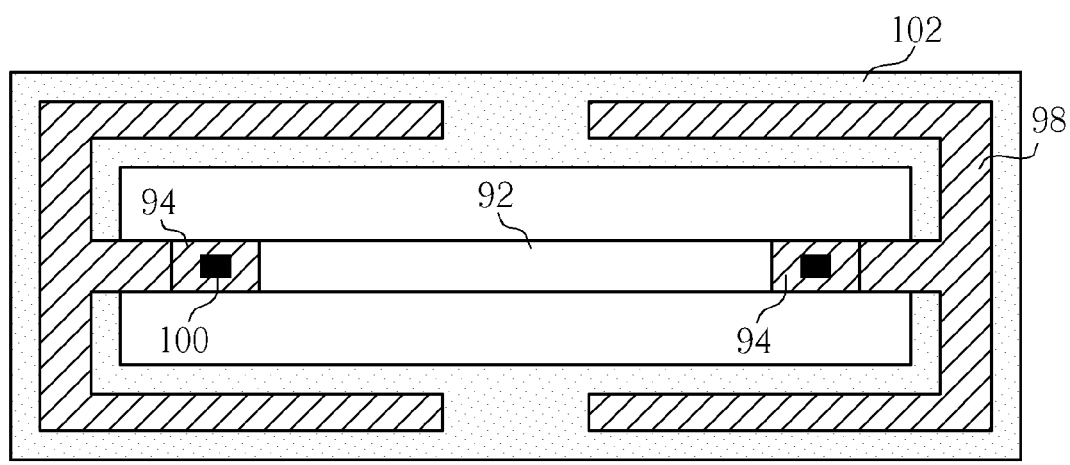

In this embodiment, the diffusion region 102 is preferably formed around the metal pattern 98 connected to only one of the primary resistance structures 94. Nevertheless, the formation of the diffusion region 102 could be applied to the structure revealed in FIG. 9, such as by forming a diffusion region 102 around the metal pattern 98 connected to both primary resistance structures 94 simultaneously, as shown in FIG. 11, which is also within the scope of the present invention.

Figure 12:
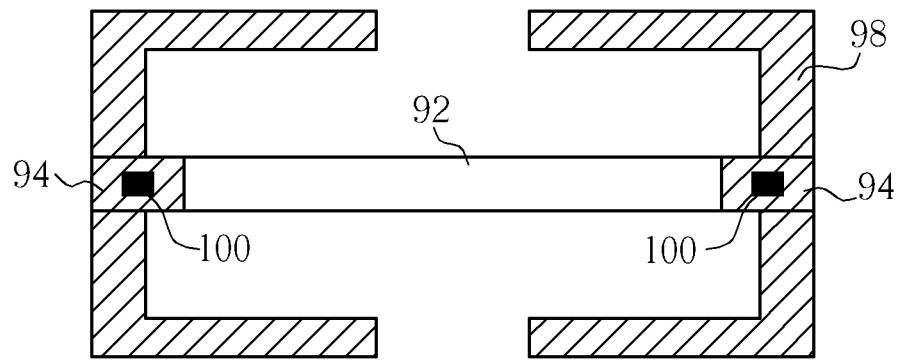
Figure 13:
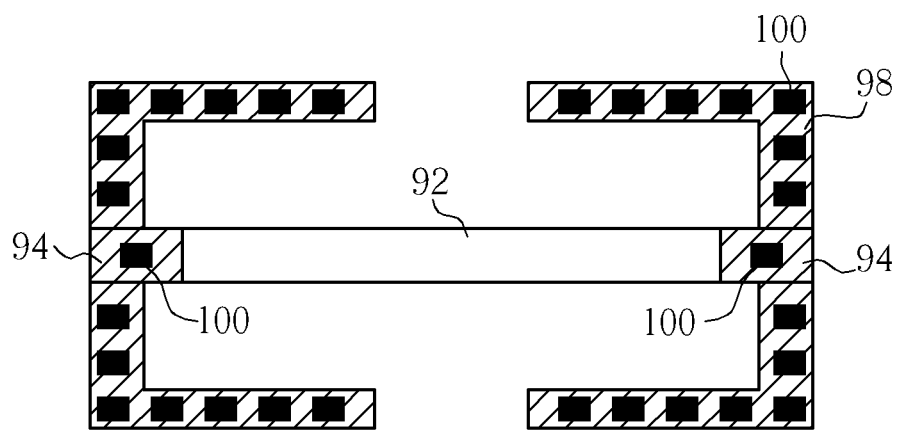
Figure 14:
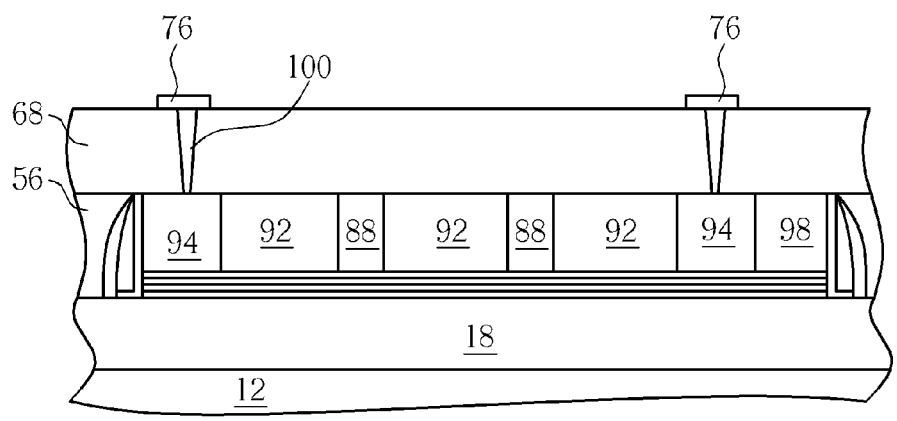
FIG. 14 illustrates a perspective view of the metal pattern on the same level as the primary resistance structures and secondary resistance structures according to an embodiment of the present invention.

Referring to FIG. 12-13, FIGS. 12-13 illustrate two other variations derived from the aforementioned structures shown FIGS. 8-11. In the embodiment shown in FIG. 12, as the metal pattern 98 is connected to both primary resistance structures 94, the metal pattern 98 is preferably not extended for a distance before splitting into two directions. Instead, each one of the primary resistance structures 94 is connected to two independent metal patterns 98 directly. Moreover, as shown in FIG. 13, a plurality of contact plugs 100 could be disposed on the metal pattern 98 to further increase the heat dissipating area of the resistor substantially.

Overall, the heat dissipating ability of the resistor could be enhanced through connecting a metal pattern to at least one of the primary resistance structures, forming a diffusion region in the substrate adjacent to or directly under the metal pattern, or increasing the quantity of contact plugs connected to the metal pattern. It should also be noted that despite only the primary resistance structures 94 and the polysilicon structure 92 are revealed in FIGS. 8-13, different arrangements involving the secondary resistance structures interlaced with the polysilicon structure as discussed in the embodiments of FIG. 7 could also be incorporated into the structures shown in FIGS. 8-13, which is also within the scope of the present invention.

Those skilled in the art will readily observe that numerous modifications and alterations of the device and method may be made while retaining the teachings of the invention.

What is claimed is:

1. A resistor, disposed on a substrate, the resistor comprising:
    a dielectric layer disposed on the substrate;
    a polysilicon structure disposed on the dielectric layer;
    two primary resistance structures disposed on the dielectric layer and at two ends of the polysilicon structure; and
    a plurality of secondary resistance structures disposed on the dielectric layer and interlaced and embedded in the polysilicon structure, wherein each bottom surface of the secondary resistances is on the same level as the bottom surface of the polysilicon structure.

2. The resistor of claim 1, wherein each of the primary resistance structures and the secondary resistance structures comprises a conductive structure.

3. The resistor of claim 1, further comprising a work function metal layer disposed between the dielectric layer and the primary resistance structures, the polysilicon structure, and the secondary resistance structures.

4. The resistor of claim 3, further comprising a cap layer disposed between the dielectric layer and the work function metal layer.

5. The resistor of claim 4, further comprising a spacer disposed on the sidewall of the primary resistance structures, the dielectric layer, the cap layer, and the work function metal layer.

6. The resistor of claim 1, further comprising a shallow trench isolation in the substrate.

7. The resistor of claim 1, further comprising a hard mask disposed on the polysilicon structure and between the primary resistance structures and the secondary resistance structures, wherein each top surface of the hard masks is on the same level as each top surface of the primary resistance structures and each top surface of the secondary resistance structures.

8. The resistor of claim 1, further comprising a metal pattern connected to at least one of the primary resistance structures.

9. The resistor of claim 8, wherein the metal pattern is on the same level as the primary resistance structures and the secondary resistance structures.

10. The resistor of claim 8, further comprising a diffusion region formed in the substrate adjacent to or directly under the metal pattern.

11. The resistor of claim 8, further comprising a plurality of contact plugs disposed on the metal pattern.

12. A metal gate transistor with resistor, comprising:
    a substrate having a transistor region and a resistor region;
    a transistor disposed on the transistor region of the substrate, wherein the transistor comprises:
        a first dielectric layer disposed on the transistor region of the substrate;
        a metal gate disposed on the first dielectric layer; and
        a source/drain region formed adjacent to two sides of the metal gate;
    a resistor disposed on the resistor region of the substrate, wherein the resistor comprises:
        a second dielectric layer disposed on the resistor region of the substrate;
        a polysilicon structure disposed on the second dielectric layer;
        two primary resistance structures disposed on the second dielectric layer and at two ends of the polysilicon structure; and
        a plurality of secondary resistance structures disposed on the second dielectric layer and interlaced and embedded in the polysilicon structure, wherein each bottom surface of the secondary resistances is on the same level as the bottom surface of the polysilicon structures.

13. The metal gate transistor with resistor of claim 12, wherein each of the primary resistance structures and the secondary resistance structures comprises a metal structure.

14. The metal gate transistor with resistor of claim 12, further comprising a work function metal layer disposed between the first dielectric layer and the metal gate and between the second dielectric layer and the primary resistance structures, the polysilicon structure, and the secondary resistance structures.

15. The metal gate transistor with resistor of claim 12, further comprising a spacer disposed on the sidewall of the primary resistance structures and the metal gate.

16. The metal gate transistor with resistor of claim 12, further comprising a shallow trench isolation disposed in the resistor region of the substrate and under the resistor.

17. The metal gate transistor with resistor of claim 12, further comprising a hard mask disposed on the polysilicon structure and between the primary resistance structures and the secondary resistance structures, wherein each top surface of the hard masks is on the same level as each top surface of the primary resistance structures and each top surface of the secondary resistance structures.

18. The metal gate transistor with resistor of claim 12, further comprising a metal pattern connected to at least one of the primary resistance structures.

19. The metal gate transistor with resistor of claim 18, further comprising a diffusion region formed in the substrate adjacent to or directly under the metal pattern.

20. The metal gate transistor with resistor of claim 18, further comprising a plurality of contact plugs disposed on the metal pattern.

* * * * *